US011302389B2

(12) United States Patent
Li

(10) Patent No.: US 11,302,389 B2
(45) Date of Patent: Apr. 12, 2022

(54) CIRCUIT FOR REDUCING LEAKAGE CURRENT OF SRAM MEMORY ARRAY AND CONTROL METHOD FOR SAME

(71) Applicant: NANJING LOW POWER IC TECHNOLOGY INSTITUTE CO., LTD., Nanjing (CN)

(72) Inventor: Xiaomin Li, Nanjing (CN)

(73) Assignee: NANJING LOW POWER IC TECHNOLOGY INSTITUTE CO., LTD., Nanjing (CN)

( * ) Notice: Subject to any disclaimer, the term of this patent is extended or adjusted under 35 U.S.C. 154(b) by 0 days.

(21) Appl. No.: 17/111,379

(22) Filed: Dec. 3, 2020

(65) Prior Publication Data

US 2021/0090640 A1    Mar. 25, 2021

(30) Foreign Application Priority Data

Jul. 23, 2020 (CN) .......................... 202010715541.8

(51) Int. Cl.
| | |
|---|---|
| *G11C 11/419* | (2006.01) |
| *G11C 11/12* | (2006.01) |
| *G11C 11/413* | (2006.01) |
| *G11C 11/412* | (2006.01) |
| *G11C 5/14* | (2006.01) |
| *G11C 11/417* | (2006.01) |

(52) U.S. Cl.
CPC .......... *G11C 11/419* (2013.01); *G11C 11/412* (2013.01); *G11C 5/147* (2013.01); *G11C 11/417* (2013.01)

(58) Field of Classification Search
CPC ... G11C 11/419; G11C 11/412; G11C 11/417; G11C 5/147
USPC .......................................... 365/154, 155, 156
See application file for complete search history.

(56) References Cited

U.S. PATENT DOCUMENTS

| | | | |
|---|---|---|---|
| 2008/0055966 A1* | 3/2008 | Ramaraju ................ | G11C 5/14 365/154 |
| 2008/0056049 A1* | 3/2008 | Moyer ................... | G11C 5/147 365/227 |
| 2009/0141579 A1* | 6/2009 | Tao .......................... | G11C 8/08 365/226 |
| 2011/0063895 A1* | 3/2011 | Komatsu ............... | G11C 11/413 365/156 |

\* cited by examiner

*Primary Examiner* — Ly D Pham
(74) *Attorney, Agent, or Firm* — CBM Patent Consulting, LLC

(57) ABSTRACT

It discloses a circuit for reducing a leakage current of a static random access memory (SRAM) memory array and a control method for the same. The circuit includes a memory array power supply voltage control module, a memory array ground terminal voltage control module and a memory array. The present invention controls the voltages on the power supply terminal and the ground terminal of the memory array through the memory array power supply voltage control module and the memory array ground terminal control module, and may reduce the actual data retention voltages of the bitcells, thereby reducing the leakage power of the SRAM in a data retention state. Meanwhile, the present invention implements the function of adjusting the data retention voltage values of the bitcells by controlling different adjustment signals to cope with different design requirements.

5 Claims, 2 Drawing Sheets

CIRCUIT FOR REDUCING LEAKAGE CURRENT OF SRAM MEMORY ARRAY AND CONTROL METHOD FOR SAME

This application claims priority to Chinese Patent Application Ser. No. CN202010715541.8 filed on 23 Jul. 2020.

FIELD OF TECHNOLOGY

The present invention belongs to the technical field of static random access memories (SRAMs), and particularly relates to a circuit for reducing a leakage current of an SRAM memory array and a control method for the same.

BACKGROUND

With the continuous development of Internet of things (IoT) technologies, the demand on energy-efficient microcontrollers applied to IoT sensor nodes grows rapidly. Because of the battery powered characteristic, the low-power design is a key to the microcontrollers. As the microcontrollers applied to the IoT technologies are typically characterized in working in the sleep mode for a long time, it is of importance to reduce the leakage power of the microcontrollers in the sleep mode. The static leakage power of the SRAM serves as the main power consumption source.

In the prior art, the peripheral logic circuit of the SRAM in the sleep mode often reduces the leakage current by the use of power gating. The memory array limits the leakage power by turning off the power gating only in a state without retaining data. Concerning some SRAMs that need to store the data, storage arrays are still in a normal power supply state, which results in that the storage arrays still have a large leakage power to restrict further improvements on energy efficiency of the microcontrollers.

SUMMARY

Invention objective: In view of the above problems, the present invention provides a circuit for reducing a leakage current of an SRAM memory array and a control method for the same. The present invention respectively controls the power supply voltage and the ground terminal voltage of the memory array by the use of the memory array power supply voltage control module and the memory array ground terminal voltage control module, and reduces the actual data retention voltage of the memory array, thereby reducing the leakage power. Meanwhile, the present invention respectively controls the drop value of the power supply voltage of the memory array and the rise value of the ground terminal of the memory array by the use of two groups of control signals to adjust the data retention voltage of the memory array, so as to cope with different design requirements.

Technical solutions: To implement the foregoing invention objective, the present invention uses the following technical solutions: a circuit for reducing a leakage current of an SRAM memory array includes a memory array power supply voltage control module, a memory array ground terminal voltage control module and a memory array; the memory array power supply voltage control module is configured to control an actual supply voltage value of the memory array; the memory array ground terminal voltage control module is configured to control an actual ground terminal voltage value of the memory array; and the memory array is configured to store data.

Further, the memory array power supply voltage control module includes an SRAM power supply terminal, a first power supply voltage control module enable signal, a second power supply voltage control module enable signal, a first power supply voltage control module adjustment signal, a second power supply voltage control module adjustment signal, a third power supply voltage control module adjustment signal, a first MOS tube, a second MOS tube, a third MOS tube, a fourth MOS tube, a fifth MOS tube, a sixth MOS tube, a seventh MOS tube, an eighth MOS tube, a ninth MOS tube, a tenth MOS tube, a first inverter, a second inverter, a third inverter and a fourth inverter.

The SRAM power supply terminal is respectively connected to a source of the first MOS tube, a source of the second MOS tube and a source of the third MOS tube, a gate of the first MOS tube is connected to the first power supply voltage control module enable signal and an input terminal of the first inverter, a drain of the first MOS tube is respectively connected to a source of the fourth MOS tube, a drain of the second MOS tube, a drain of the third MOS tube, a source of the fifth MOS tube, a source of the seventh MOS tube and a source of the ninth MOS tube, a gate of the second MOS tube is connected to an output terminal of the second inverter and an input terminal of the third inverter, and a gate of the third MOS tube is connected to an output terminal of the fourth inverter; an output terminal of the first inverter is connected to an input terminal of the second inverter; an output terminal of the third inverter is connected to an input terminal of the fourth inverter; a gate of the fourth MOS tube is connected to the second power supply voltage control module enable signal, and a drain of the fourth MOS tube is respectively connected to a drain of the sixth MOS tube, a drain of the eighth MOS tube and a drain of the tenth MOS tube; a gate of the fifth MOS tube is connected to the first power supply voltage control module adjustment signal and a gate of the sixth MOS tube, and a drain of the fifth MOS tube is connected to a source of the sixth MOS tube; a gate of the seventh MOS tube is connected to the second power supply voltage control module adjustment signal and a gate of the eighth MOS tube, and a drain of the seventh MOS tube is connected to a source of the eighth MOS tube; and a gate of the ninth MOS tube is connected to the third power supply voltage control module adjustment signal and a gate of the tenth MOS tube, and a drain of the ninth MOS tube is connected to a source of the tenth MOS tube.

Further, the memory array ground terminal voltage control module includes an SRAM ground terminal, a third ground terminal voltage module enable signal, a fourth ground terminal voltage control module adjustment signal, a fifth terminal voltage control module adjustment signal, a sixth terminal voltage control module adjustment signal, an eleventh MOS tube, a twelfth MOS tube, a thirteenth MOS tube, a fourteenth MOS tube, a fifteenth MOS tube, a sixteenth MOS tube and a seventeenth MOS tube.

The SRAM ground terminal is respectively connected to a drain of the eleventh MOS tube, a drain of the thirteenth MOS tube, a drain of the fifteenth MOS tube and a drain of the seventeenth MOS tube; a gate of the eleventh MOS tube is connected to the third ground terminal voltage control module enable signal, and a source of the eleventh MOS tube is respectively connected to a source of the twelfth MOS tube, a source of the fourteenth MOS tube and a source of the sixteenth MOS tube; a gate of the twelfth MOS tube is respectively connected to the fourth ground terminal voltage control module adjustment signal and a source of the thirteenth MOS tube, and a drain of the twelfth MOS tube is connected to the source of the thirteenth MOS tube; a gate of the fourteenth MOS tube is connected to the fifth ground terminal voltage control module adjustment signal and a source of the fifteenth MOS tube, and a drain of the fourteenth MOS tube is connected to the source of the fifteenth MOS tube; and a gate of the sixteenth MOS tube is connected to the sixth ground terminal voltage control module adjustment signal and a source of the seventeenth MOS tube, and a drain of the sixteenth MOS tube is connected to the source of the seventeenth MOS tube.

Further, the memory array includes N bitcells, a memory array adjustable power supply terminal and a memory array adjustable ground terminal.

The memory array adjustable power supply terminal is connected to the drains of the fourth MOS tube, the sixth MOS tube, the eighth MOS tube and the tenth MOS tube; and the memory array adjustable ground terminal is connected to the sources of the eleventh MOS tube, the twelfth MOS tube, the fourteenth MOS tube and the sixteenth MOS tube.

A control method of a circuit for reducing a leakage current of an SRAM memory array includes: when a first power supply voltage control module enable signal, a second power supply voltage control module enable signal and a third ground terminal voltage control module enable signal are all effective, enabling the memory array to normally execute a read-write operation; when the first power supply voltage control module enable signal is effective while both the second power supply voltage control module enable signal and the third ground terminal voltage control module enable signal are ineffective, adjusting a drop of a power supply voltage of the memory array and a voltage value of a ground terminal voltage of the memory array by configuring the turning-on number of switches; and when the first power supply voltage control module enable signal is ineffective, turning off the power supply voltage of the memory array, such that bitcells no longer store data.

Further, when the first power supply voltage control module enable signal is effective while both the second power supply voltage control module enable signal and the third ground terminal voltage module enable signal are ineffective, configuring the switches to control the power supply voltage and the ground terminal voltage of the memory array is as follows:

controlling, when a first power supply voltage control module adjustment signal, a second power supply voltage control module adjustment signal and a third power supply voltage control module adjustment signal are all at a high level, the power supply voltage of the memory array to implement a first level of drop; controlling, when both the first power supply voltage control module adjustment signal and the second power supply voltage control module adjustment signal are at the high level while the third power supply voltage control module adjustment signal is at a low level, the power supply voltage of the memory array to implement a second level of drop; and controlling, when the first power supply voltage control module adjustment signal is at the high level while both the second power supply voltage control module adjustment signal and the third power supply voltage control module adjustment signal are at the low level, the power supply voltage of the memory array to implement a third level of drop; and controlling, when a fourth ground terminal voltage control module adjustment signal, a fifth terminal voltage control module adjustment signal and a sixth terminal voltage control module adjustment signal are all at the low level, the ground terminal voltage of the memory array to implement a first level of rise; controlling, when both the fourth ground terminal voltage control module adjustment signal and the fifth terminal voltage control module adjustment signal are at the low level while the sixth terminal voltage control module adjustment signal is at the high level, the ground terminal voltage of the memory array to implement a second level of rise; and controlling, when the fourth ground terminal voltage control module adjustment signal is at the low level while both the fifth terminal voltage control module adjustment signal and the sixth terminal voltage control module adjustment signal are at the high level, the ground terminal voltage of the memory array to implement a third level of rise.

Beneficial effects: The present invention controls the voltages on the power supply terminal and the ground terminal of the memory array through the memory array power supply voltage control module and the memory array ground terminal voltage control module on the premise of not affecting the normal read-write operation of the memory array, and may reduce the actual data retention voltages of the bitcells, thereby reducing the leakage power of the SRAM in a data retention state. Meanwhile, the present invention implements the function of adjusting the data retention voltage values of the bitcells by controlling different adjustment signals to cope with different design requirements.

DESCRIPTION OF THE EMBODIMENTS

The technical solutions of the present invention are further described below in combination with the accompanying drawings and embodiments.

Figure 1:
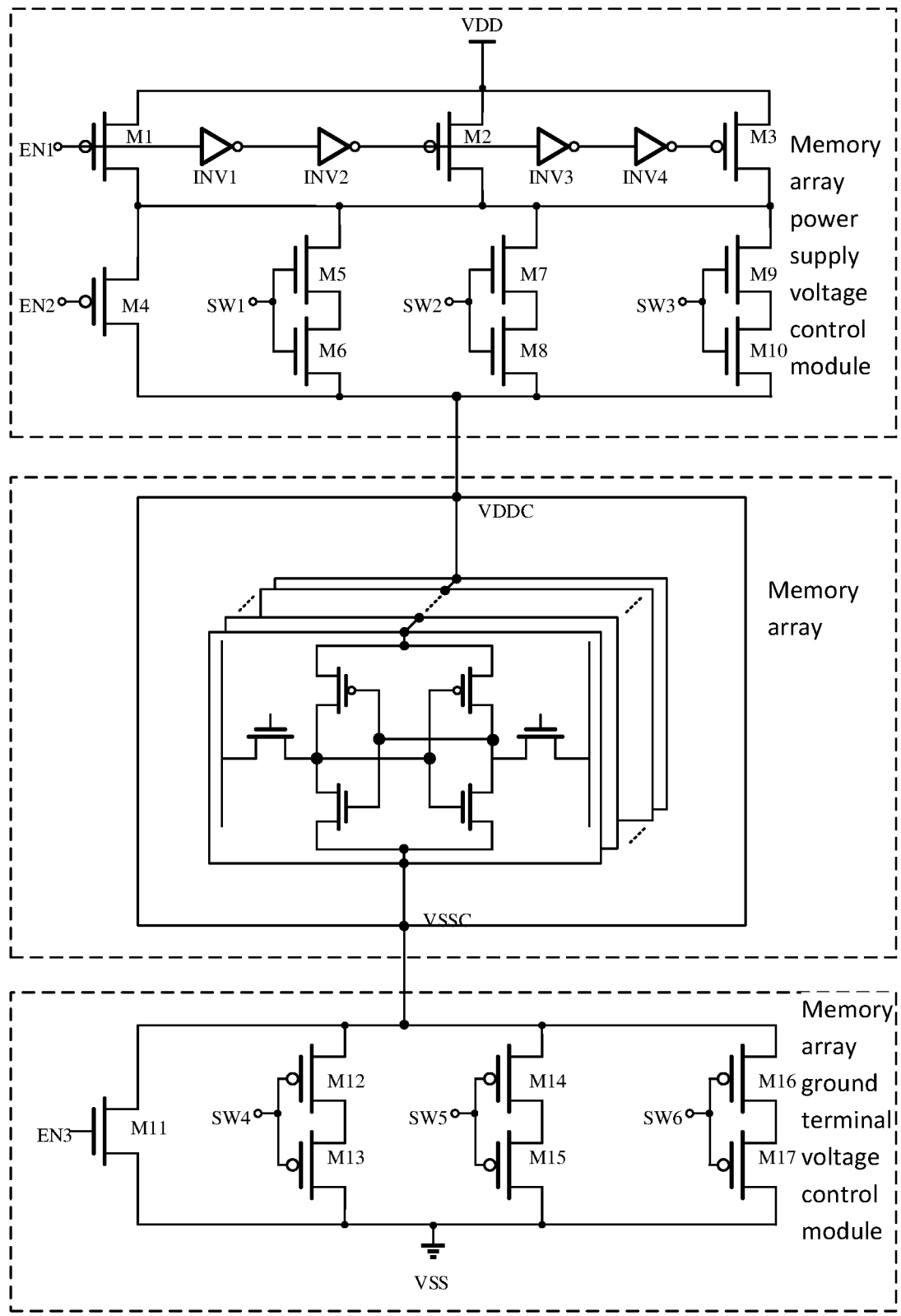
FIG. 1 is a circuit diagram for reducing a leakage current of an SRAM memory array.

As shown in FIG. 1, a circuit for reducing a leakage current of an SRAM memory array provided by the present invention includes a memory array power supply voltage control module, a memory array ground terminal voltage control module and a memory array; the memory array power supply voltage control module is configured to control an actual supply voltage value of the memory array; the memory array ground terminal voltage control module is configured to control an actual ground terminal voltage value of the memory array; and the memory array is configured to store data. When enable signals E1, E2 and E3 are effective, the memory array may normally execute a read-write operation. When the E1 is effective while both the E2 and the E3 are ineffective, adjustment signals SW1, SW2, SW3, SW4, SW5 and SW6 implement a drop of the power supply voltage VDDC of the memory array and a rise of the ground terminal voltage VSSC of the memory array, and voltage values of the VDDC and the VSSC are adjusted by configuring the turning-on number of switches. When the E1 is ineffective, the power supply voltage of the memory array is turned off, such that bitcells no longer store data.

When the E1 is effective while both the E2 and the E3 are ineffective, control methods of the adjustment signals SW1, SW2, SW3, SW4, SW5 and SW6 on the power supply voltage VDDC and the ground terminal voltage VSSC of the memory array are as follows: when the adjustment signals SW1, SW2 and SW3 are all at a high level, the power supply voltage VDDC of the memory array is controlled to implement a first level of drop; when both the adjustment signals SW1 and SW2 are at the high level while the adjustment signal SW3 is at a low level, the power supply voltage VDDC of the memory array is controlled to implement a second level of drop; and when the adjustment signal SW1 is at the high level while both the SW2 and the SW3 are at the low level, the power supply voltage VDDC of the memory array is controlled to implement a third level of drop. When the adjustment signals SW4, SW5 and SW6 are all at the low level, the ground terminal voltage VSSC of the memory array is controlled to implement a first level of rise; when both the adjustment signals SW4 and SW5 are at the low level while the SW6 is at the high level, the ground terminal voltage VSSC of the memory array is controlled to implement a second level of rise; and when the adjustment signal SW4 is at the low level while both the SW5 and the SW6 are at the high level, the ground terminal voltage VSSC of the memory array is controlled to implement a third level of rise.

The present invention respectively controls the drop value of the power supply voltage of the memory array and the rise value of the ground terminal of the memory array by the use of two groups of control signals to adjust the data retention voltage of the memory array, so as to cope with different design requirements.

The memory array power supply voltage control module includes an SRAM power supply terminal VDD, a first power supply voltage control module enable signal EN1, a second power supply voltage control module enable signal EN2, a first power supply voltage control module adjustment signal SW1, a second power supply voltage control module adjustment signal SW2, a third power supply voltage control module adjustment signal SW3, a first MOS tube M1, a second MOS tube M2, a third MOS tube M3, a fourth MOS tube M4, a fifth MOS tube M5, a sixth MOS tube M6, a seventh MOS tube M7, an eighth MOS tube M8, a ninth MOS tube M9, a tenth MOS tube M10, a first inverter INV1, a second inverter INV2, a third inverter INV3 and a fourth inverter INV4.

The SRAM power supply terminal VDD is respectively connected to a source of the first MOS tube M1, a source of the second MOS tube M2 and a source of the third MOS tube M3, a gate of the first MOS tube M1 is connected to the first power supply voltage control module enable signal EN1 and an input terminal of the first inverter INV1, a drain of the first MOS tube M1 is respectively connected to a source of the fourth MOS tube M4, a drain of the second MOS tube M2, a drain of the third MOS tube M3, a source of the fifth MOS tube M5, a source of the seventh MOS tube M7 and a source of the ninth MOS tube M9, a gate of the second MOS tube M2 is connected to an output terminal of the second inverter INV2 and an input terminal of the third inverter INV3, and a gate of the third MOS tube M3 is connected to an output terminal of the fourth inverter INV4; an output terminal of the first inverter INV1 is connected to an input terminal of the second inverter INV2; an output terminal of the third inverter INV3 is connected to an input terminal of the fourth inverter INV4; a gate of the fourth MOS tube M4 is connected to the second power supply voltage control module enable signal EN2, and a drain of the fourth MOS tube M4 is respectively connected to a drain of the sixth MOS tube M6, a drain of the eighth MOS tube M8 and a drain of the tenth MOS tube M10; a gate of the fifth MOS tube M5 is connected to the first power supply voltage control module adjustment signal SW1 and a gate of the sixth MOS tube M6, and a drain of the fifth MOS tube M5 is connected to a source of the sixth MOS tube M6; a gate of the seventh MOS tube M7 is connected to the second power supply voltage control module adjustment signal SW2 and a gate of the eighth MOS tube M8, and a drain of the seventh MOS tube M7 is connected to a source of the eighth MOS tube M8; and a gate of the ninth MOS tube M9 is connected to the third power supply voltage control module adjustment signal SW3 and a gate of the tenth MOS tube M10, and a drain of the ninth MOS tube M9 is connected to a source of the tenth MOS tube M10.

The memory array ground terminal voltage control module includes an SRAM ground terminal VSS, a third ground terminal voltage module enable signal EN3, a fourth ground terminal voltage control module adjustment signal SW4, a fifth terminal voltage control module adjustment signal SW5, a sixth terminal voltage control module adjustment signal SW6, an eleventh MOS tube M11, a twelfth MOS tube M12, a thirteenth MOS tube M13, a fourteenth MOS tube M14, a fifteenth MOS tube M15, a sixteenth MOS tube M16 and a seventeenth MOS tube M17.

The SRAM ground terminal VSS is respectively connected to a drain of the eleventh MOS tube M11, a drain of the thirteenth MOS tube M13, a drain of the fifteenth MOS tube M15 and a drain of the seventeenth MOS tube M17; a gate of the eleventh MOS tube M11 is connected to the third ground terminal voltage control module enable signal EN3, and a source of the eleventh MOS tube M11 is respectively connected to a source of the twelfth MOS tube M12, a source of the fourteenth MOS tube M14 and a source of the sixteenth MOS tube M16; a gate of the twelfth MOS tube M12 is respectively connected to the fourth ground terminal voltage control module adjustment signal SW4 and a source of the thirteenth MOS tube M13, and a drain of the twelfth MOS tube M12 is connected to the source of the thirteenth MOS tube M13; a gate of the fourteenth MOS tube M14 is connected to the fifth ground terminal voltage control module adjustment signal SW5 and a source of the fifteenth MOS tube M15, and a drain of the fourteenth MOS tube M14 is connected to the source of the fifteenth MOS tube M15; and a gate of the sixteenth MOS tube M16 is connected to the sixth ground terminal voltage control module adjustment signal SW6 and a source of the seventeenth MOS tube M17, and a drain of the sixteenth MOS tube M16 is connected to the source of the seventeenth MOS tube M17.

The memory array includes N bitcells, a memory array adjustable power supply terminal VDDC and a memory array adjustable ground terminal VSSC.

The memory array adjustable power supply terminal VDDC is connected to the drains of the fourth MOS tube M4, the sixth MOS tube M6, the eighth MOS tube M8 and the tenth MOS tube M10; and the memory array adjustable ground terminal VSSC is connected to the sources of the eleventh MOS tube M11, the twelfth MOS tube M12, the fourteenth MOS tube M14 and the sixteenth MOS tube M16.

Therefore, the present invention has the advantages that the present invention controls the voltages on the power supply terminal and the ground terminal of the memory array through the memory array power supply voltage control module and the memory array ground terminal voltage control module on the premise of not affecting the normal read-write operation of the memory array, and may reduce the actual data retention voltages of the bitcells, thereby reducing the leakage power of the SRAM in a data retention state. Meanwhile, the present invention implements the function of adjusting the data retention voltage values of the bitcells by controlling different adjustment signals to cope with different design requirements.

Figure 2:
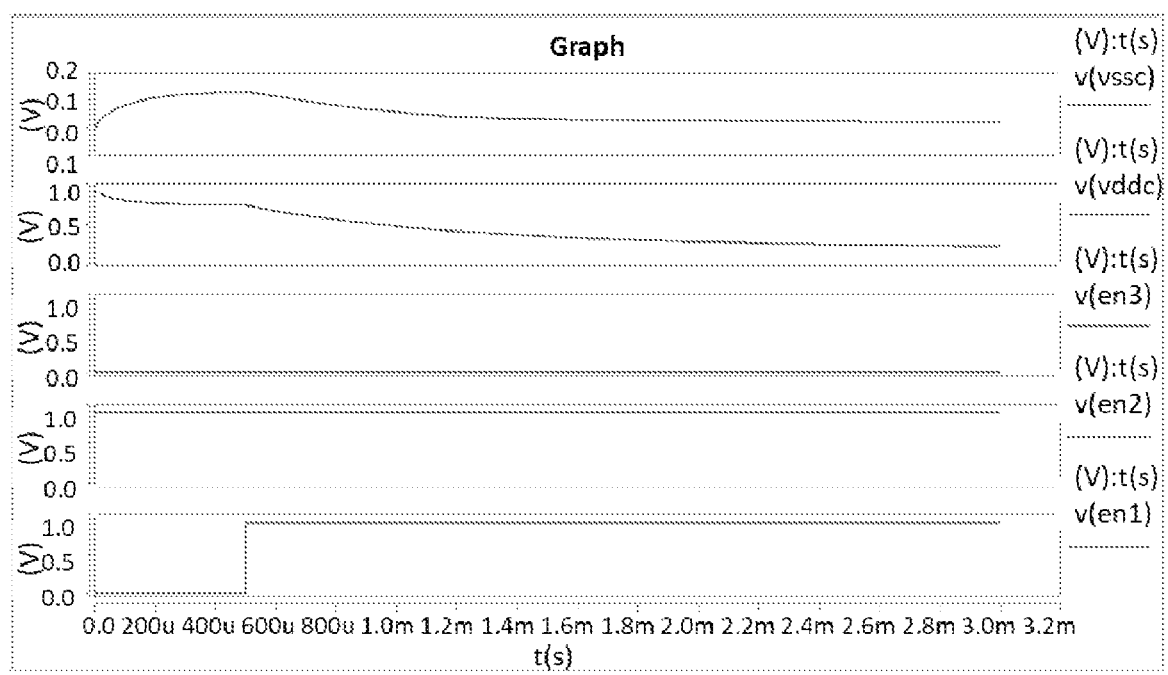
FIG. 2 is an oscillograph of a data retention voltage control circuit.

As shown in FIG. 2 that is the oscillograph of the data retention voltage control circuit in the embodiment, the control effects of different power supply voltage module enable signals E1 and E2 and the ground terminal voltage module enable signal E3 on the drop of the VDDC and the rise of the VSSC may be seen.

What is claimed is:

1. A circuit for reducing a leakage current of a static random access memory (SRAM) memory array, comprising a memory array power supply voltage control module, a memory array ground terminal voltage control module and a memory array, wherein
the memory array power supply voltage control module is configured to control an actual supply voltage value of the memory array;
the memory array ground terminal voltage control module is configured to control an actual ground terminal voltage value of the memory array; and
the memory array is configured to store data;
wherein the memory array power supply voltage control module comprises an SRAM power supply terminal (VDD), a first power supply voltage control module enable signal (EN1), a second power supply voltage control module enable signal (EN2), a first power supply voltage control module adjustment signal (SW1), a second power supply voltage control module adjustment signal (SW2), a third power supply voltage control module adjustment signal (SW3), a first metal oxide semiconductor (MOS) tube (M1), a second MOS tube (M2), a third MOS tube (M3), a fourth MOS tube (M4), a fifth MOS tube (M5), a sixth MOS tube (M6), a seventh MOS tube (M7), an eighth MOS tube (M8), a ninth MOS tube (M9), a tenth MOS tube (M10), a first inverter (INV1), a second inverter (INV2), a third inverter (INV3) and a fourth inverter (INV4),
wherein the SRAM power supply terminal (VDD) is respectively connected to a source of the first MOS tube (M1), a source of the second MOS tube (M2) and a source of the third MOS tube (M3), a gate of the first MOS tube (M1) is connected to the first power supply voltage control module enable signal (EN1) and an input terminal of the first inverter (INV1), a drain of the first MOS tube (M1) is respectively connected to a source of the fourth MOS tube (M4), a drain of the second MOS tube (M2), a drain of the third MOS tube (M3), a source of the fifth MOS tube (M5), a source of the seventh MOS tube (M7) and a source of the ninth MOS tube (M9), a gate of the second MOS tube (M2) is connected to an output terminal of the second inverter (INV2) and an input terminal of the third inverter (INV3), and a gate of the third MOS tube (M3) is connected to an output terminal of the fourth inverter (INV4); an output terminal of the first inverter (INV1) is connected to an input terminal of the second inverter (INV2); an output terminal of the third inverter (INV3) is connected to an input terminal of the fourth inverter (INV4); a gate of the fourth MOS tube (M4) is connected to the second power supply voltage control module enable signal (EN2), and a drain of the fourth MOS tube (M4) is respectively connected to a drain of the sixth MOS tube (M6), a drain of the eighth MOS tube (M8) and a drain of the tenth MOS tube (M10); a gate of the fifth MOS tube (M5) is connected to the first power supply voltage control module adjustment signal (SW1) and a gate of the sixth MOS tube (M6), and a drain of the fifth MOS tube (M5) is connected to a source of the sixth MOS tube (M6); a gate of the seventh MOS tube (M7) is connected to the second power supply voltage control module adjustment signal (SW2) and a gate of the eighth MOS tube (M8), and a drain of the seventh MOS tube (M7) is connected to a source of the eighth MOS tube (M8); and a gate of the ninth MOS tube (M9) is connected to the third power supply voltage control module adjustment signal (SW3) and a gate of the tenth MOS tube (M10), and a drain of the ninth MOS tube (M9) is connected to a source of the tenth MOS tube (M10).

2. The circuit for reducing the leakage current of the SRAM memory array according to claim 1, wherein the memory array ground terminal voltage control module comprises an SRAM ground terminal (VSS), a third ground terminal voltage module enable signal (EN3), a fourth ground terminal voltage control module adjustment signal (SW4), a fifth terminal voltage control module adjustment signal (SW5), a sixth terminal voltage control module adjustment signal (SW6), an eleventh MOS tube (M11), a twelfth MOS tube (M12), a thirteenth MOS tube (M13), a fourteenth MOS tube (M14), a fifteenth MOS tube (M15), a sixteenth MOS tube (M16) and a seventeenth MOS tube (M17),
wherein the SRAM ground terminal (VSS) is respectively connected to a drain of the eleventh MOS tube (M11), a drain of the thirteenth MOS tube (M13), a drain of the fifteenth MOS tube (M15) and a drain of the seventeenth MOS tube (M17); a gate of the eleventh MOS tube (M11) is connected to the third ground terminal voltage control module enable signal (EN3), and a source of the eleventh MOS tube (M11) is respectively connected to a source of the twelfth MOS tube (M12), a source of the fourteenth MOS tube (M14) and a source of the sixteenth MOS tube (M16); a gate of the twelfth MOS tube (M12) is respectively connected to the fourth ground terminal voltage control module adjustment signal (SW4) and a source of the thirteenth MOS tube (M13), and a drain of the twelfth MOS tube (M12) is connected to the source of the thirteenth MOS tube (M13); a gate of the fourteenth MOS tube (M14) is connected to the fifth ground terminal voltage control module adjustment signal (SW5) and a source of the fifteenth MOS tube (M15), and a drain of the fourteenth MOS tube (M14) is connected to the source of the fifteenth MOS tube (M15); and a gate of the sixteenth MOS tube (M16) is connected to the sixth ground terminal voltage control module adjustment signal (SW6) and a source of the seventeenth MOS tube (M17), and a drain of the sixteenth MOS tube (M16) is connected to the source of the seventeenth MOS tube (M17).

3. The circuit for reducing the leakage current of the SRAM memory array according to claim 1, wherein the memory array comprises N bitcells, a memory array adjustable power supply terminal (VDDC) and a memory array adjustable ground terminal (VSSC),
wherein the memory array adjustable power supply terminal (VDDC) is connected to the drains of the fourth MOS tube (M4), the sixth MOS tube (M6), the eighth MOS tube (M8) and the tenth MOS tube (M10); and the memory array adjustable ground terminal (VSSC) is connected to the sources of the eleventh MOS tube (M11), the twelfth MOS tube (M12), the fourteenth MOS tube (M14) and the sixteenth MOS tube (M16).

4. A control method of a circuit for reducing a leakage current of a static random access memory (SRAM) memory array, based on the circuit for reducing the leakage current of the SRAM memory array according to claim 1, comprising: when the first power supply voltage control module enable signal (EN1), the second power supply voltage control module enable signal (EN2) and the third ground terminal voltage module enable signal (EN3) are effective, enabling the memory array to normally execute a read-write operation;

when the first power supply voltage control module enable signal (EN1) is effective while both the second power supply voltage control module enable signal (EN2) and the third ground terminal voltage module enable signal (EN3) are ineffective, adjusting a drop of a power supply voltage of the memory array and a voltage value of a ground terminal voltage of the memory array by configuring the turning-on number of switches; and when the first power supply voltage control module enable signal (EN1) is ineffective, turning off the power supply voltage of the memory array, such that the bitcells no longer store data.

5. The control method of the circuit for reducing the leakage current of the SRAM according to claim 4, when the first power supply voltage control module enable signal (EN1) is effective while both the second power supply voltage control module enable signal (EN2) and the third ground terminal voltage module enable signal (EN3) are ineffective, configuring the switches to control the power supply voltage and the ground terminal voltage of the memory array is as follows:

controlling, when the first power supply voltage control module adjustment signal (SW1), the second power supply voltage control module adjustment signal (SW2) and the third power supply voltage control module adjustment signal (SW3) are all at a high level, the power supply voltage (VDDC) of the memory array to implement a first level of drop; controlling, when both the first power supply voltage control module adjustment signal (SW1) and the second power supply voltage control module adjustment signal (SW2) are at the high level while the third power supply voltage control module adjustment signal (SW3) is at a low level, the power supply voltage (VDDC) of the memory array to implement a second level of drop; and controlling, when the first power supply voltage control module adjustment signal (SW1) is at the high level while both the second power supply voltage control module adjustment signal (SW2) and the third power supply voltage control module adjustment signal (SW3) are at the low level, the power supply voltage (VDDC) of the memory array to implement a third level of drop; and controlling, when the fourth ground terminal voltage control module adjustment signal (SW4), the fifth terminal voltage control module adjustment signal (SW5) and the sixth terminal voltage control module adjustment signal (SW6) are all at the low level, the ground terminal voltage (VSSC) of the memory array to implement a first level of rise; controlling, when both the fourth ground terminal voltage control module adjustment signal (SW4) and the fifth terminal voltage control module adjustment signal (SW5) are at the low level while the sixth terminal voltage control module adjustment signal (SW6) is at the high level, the ground terminal voltage (VSSC) of the memory array to implement a second level of rise; and controlling, when the fourth ground terminal voltage control module adjustment signal (SW4) is at the low level while both the fifth terminal voltage control module adjustment signal (SW5) and the sixth terminal voltage control module adjustment signal (SW6) are at the high level, the ground terminal voltage (VSSC) of the memory array to implement a third level of rise.

* * * * *